(12) United States Patent  (10) Patent No.: US 7,973,375 B2
Koga                     (45) Date of Patent:     Jul. 5, 2011

(54) SPIN TRANSISTOR AND METHOD OF MANUFACTURING SAME

(75) Inventor: Keiji Koga, Saku (JP)

(73) Assignee: TDK Corporation, Tokyo (JP)

( * ) Notice: Subject to any disclaimer, the term of this patent is extended or adjusted under 35 U.S.C. 154(b) by 299 days.

(21) Appl. No.: 12/201,245

(22) Filed: Aug. 29, 2008

(65) Prior Publication Data

US 2009/0057793 A1     Mar. 5, 2009

(30) Foreign Application Priority Data

Sep. 4, 2007  (JP) ................ 2007-229199

(51) Int. Cl.
*H01L 29/00* (2006.01)

(52) U.S. Cl. ............... 257/421; 257/295; 257/E29.001; 365/171; 365/173

(58) Field of Classification Search ............... 257/295, 257/40, 183, 193, 421, E29.001, E21.001; 365/171, 173
See application file for complete search history.

(56) References Cited

U.S. PATENT DOCUMENTS

| 5,654,566 | A | 8/1997 | Johnson |
| 6,482,729 | B2 * | 11/2002 | Ohno et al. ............ 438/602 |
| 6,873,545 | B2 | 3/2005 | Johnson |
| 7,629,658 | B2 * | 12/2009 | Sugiyama et al. ....... 257/421 |
| 2006/0043443 | A1 | 3/2006 | Sugahara et al. |
| 2006/0114018 | A1 | 6/2006 | Sugahara et al. |
| 2006/0118839 | A1 * | 6/2006 | Sugahara et al. ....... 257/295 |
| 2006/0138502 | A1 | 6/2006 | Sugahara et al. |
| 2008/0061336 | A1 | 3/2008 | Sugahara et al. |

FOREIGN PATENT DOCUMENTS

| JP | A-2004-111904 | 4/2004 |
| WO | WO 2004/079827 | 9/2004 |
| WO | WO 2004/086625 | 10/2004 |

* cited by examiner

*Primary Examiner* — Thinh T Nguyen
(74) *Attorney, Agent, or Firm* — Oliff & Berridge, PLC

(57) ABSTRACT

The spin transistor in accordance with the present invention comprises a magnetoresistive element having a fixed layer, a free layer, and a semiconductor layer provided between the fixed layer and free layer; a source electrode layer electrically connected to one end face in a laminating direction of the magnetoresistive element; a drain electrode layer electrically connected to the other end face in the laminating direction of the magnetoresistive element; and a gate electrode layer laterally adjacent to the semiconductor layer through a gate insulating layer provided on a side face of the semiconductor layer.

9 Claims, 17 Drawing Sheets

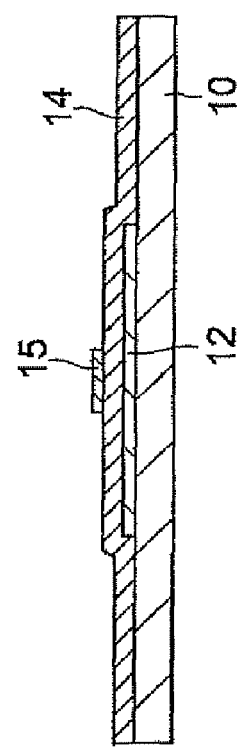
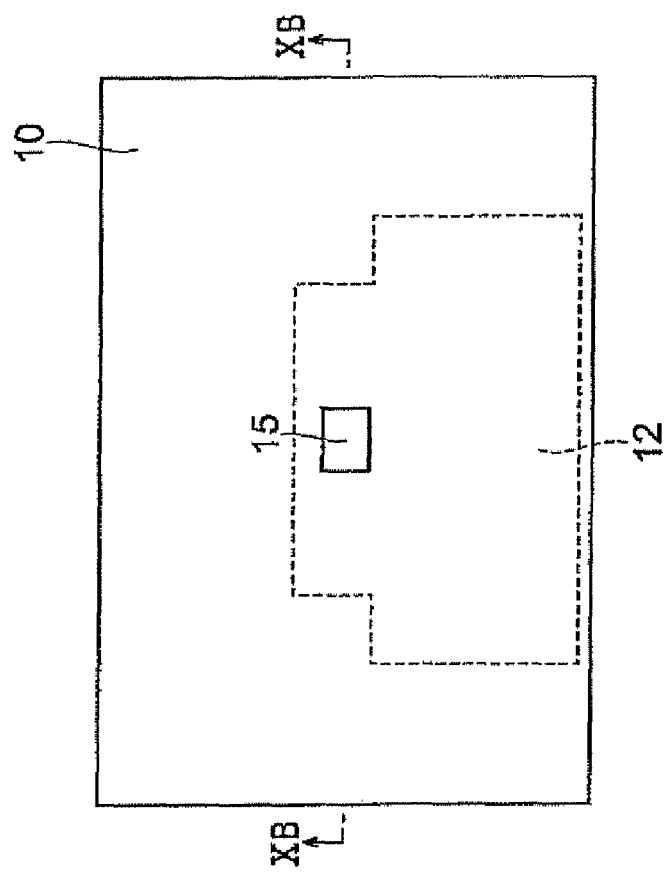

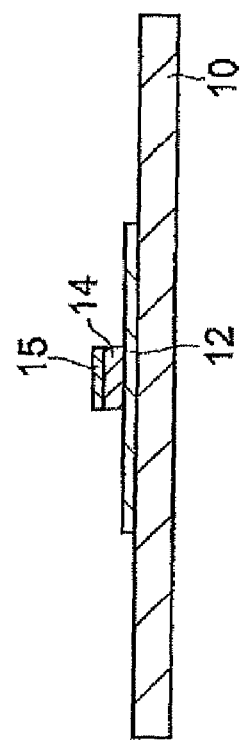
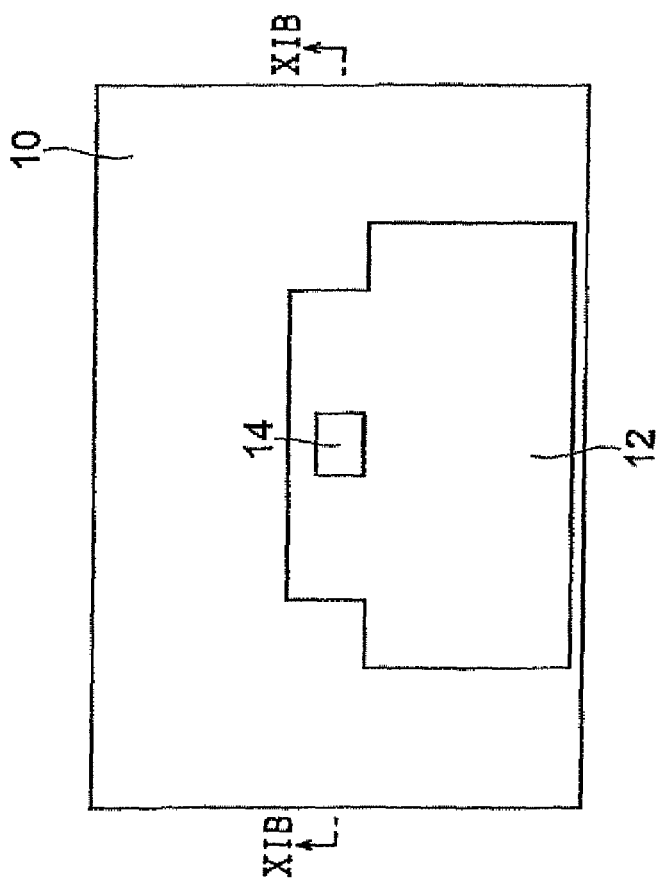

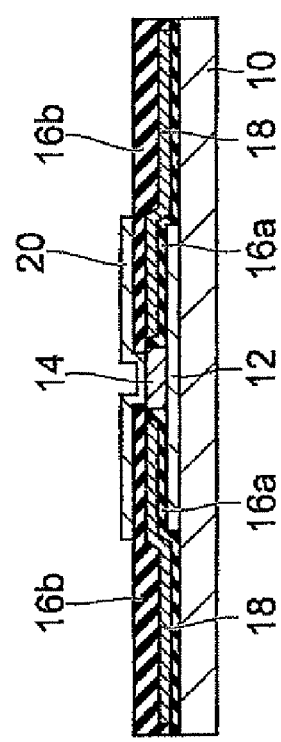
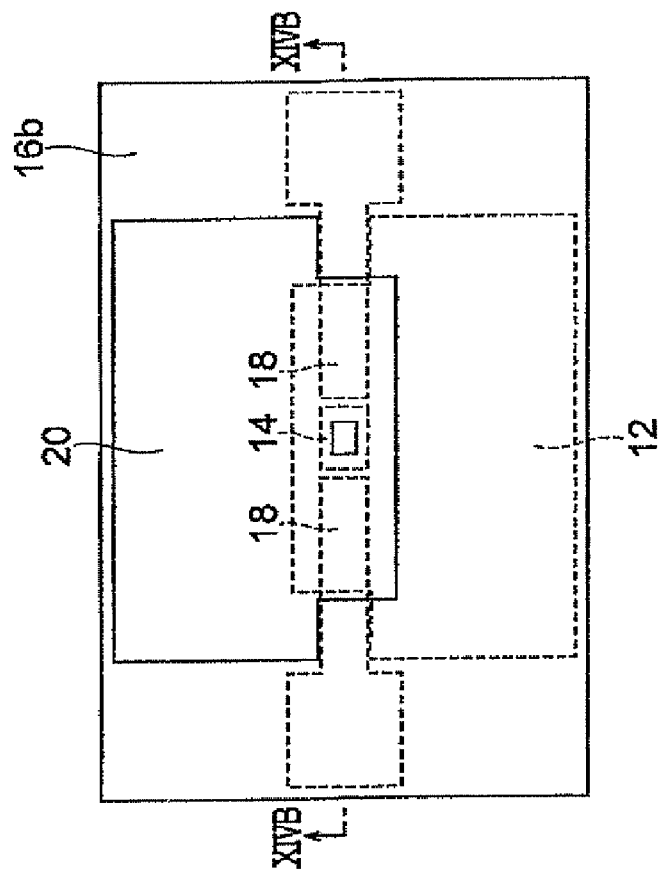
Fig. 14B
Fig. 14A

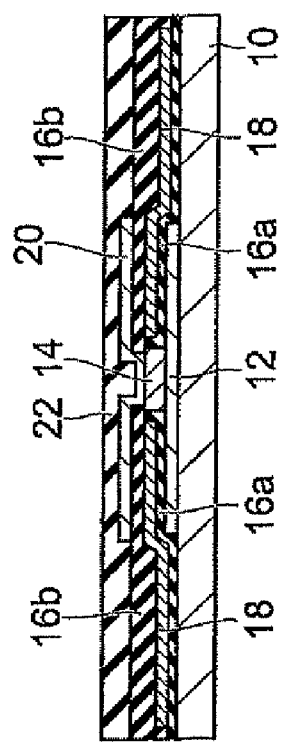
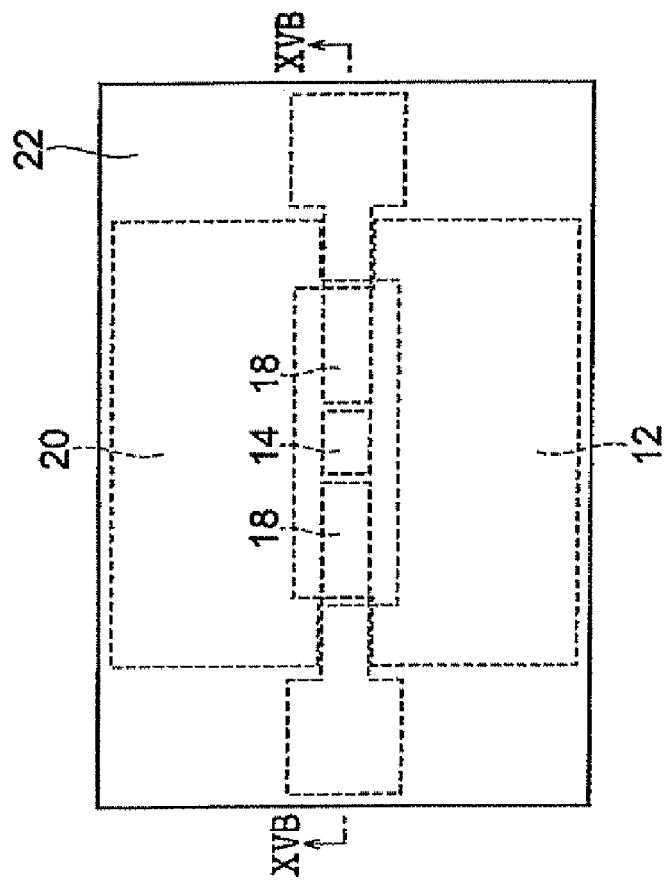
Fig. 15A
Fig. 15B

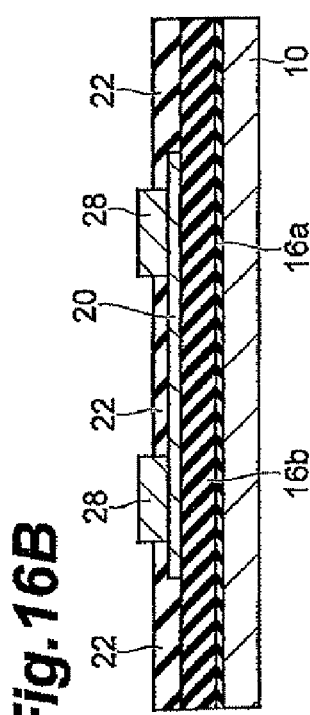
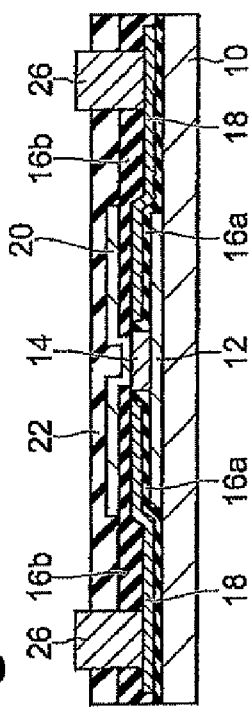
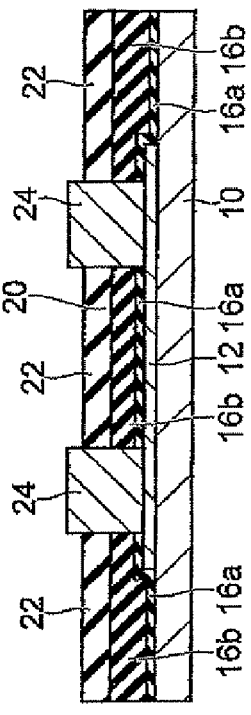
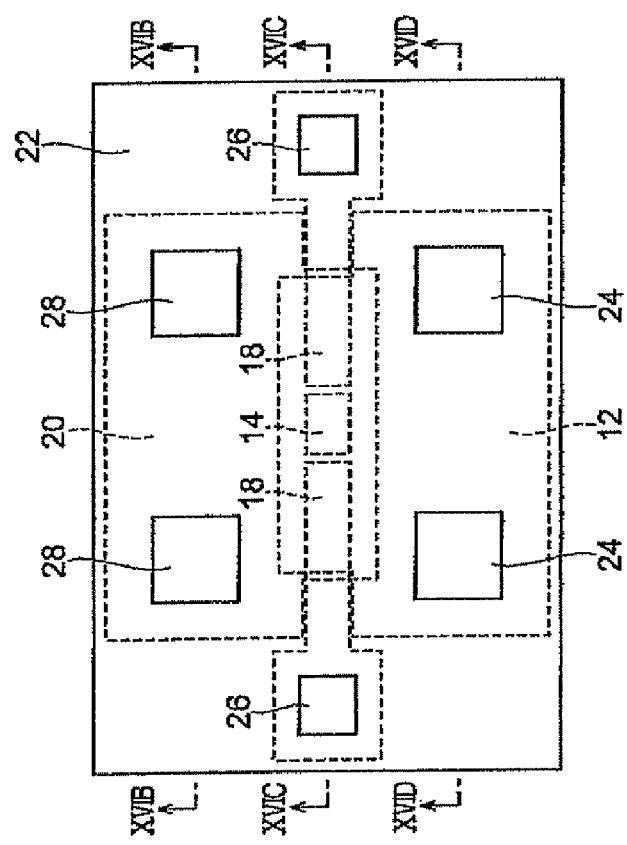

SPIN TRANSISTOR AND METHOD OF MANUFACTURING SAME

BACKGROUND OF THE INVENTION

1. Field of the Invention

The present invention relates to a spin transistor and a method of manufacturing the same.

2. Related Background Art

Attention has recently been focused on studies about spin electronics. Spin transistors, which are transistors utilizing spins of electrons, have been expected to bring about new technological innovations. The spin transistors can be employed as storage devices having new structures (see Japanese Patent Application Laid-Open No, 2004-111904 and International Publication Pamphlet WO2004/079827) and multifunctional logic circuits (see International Publication Pamphlet WO2004/086625). They are made by magnetic material processes and thus may also be used as control devices for magnetic devices.

In particular, FIG. 11 of Japanese Patent Application Laid-Open No. 2004-111904, FIG. 4 of U.S. Pat. No. 6,873,545B2, and FIG. 4 of U.S. Pat. No. 5,654,566 disclose spin transistors in which a nonmagnetic semiconductor layer is interposed between two ferromagnetic metals constituting source and drain electrodes, respectively, while a gate electrode layer is provided on the semiconductor layer with a gate insulating layer interposed therebetween or a gate electrode is provided in Schottky contact with the semiconductor layer.

In such conventional spin transistors, the source electrode injects spin-polarized electrons into the semiconductor layer. Namely, the source electrode has both functions of a typical electrode and a spin-polarized electron injection layer. The polarizing direction of electrons injected into the semiconductor layer depends on the magnetization direction of the source electrode, while the spin polarization ratio of electrons injected into the semiconductor layer depends on the spin polarization ratio of the source electrode acting as the spin-polarized electron injection layer.

The electrons injected into the drain through a channel of the semiconductor layer are scattered depending on the direction of their polarization. In other words, the electrons injected into the semiconductor channel from the source electrode are subjected to spin-dependent scattering on the drain electrode side. Namely, the drain electrode has both functions of a typical electrode and a spin filter layer for preferentially receiving electrodes polarized in a specific direction. Therefore, the resistance between the source and drain electrodes becomes smaller and greater when the source and drain electrodes are magnetized in directions parallel and antiparallel, respectively, to each other.

SUMMARY OF THE INVENTION

When a spin transistor is to be applied to storage devices and the like, it will be more preferred if the resistance between the source and drain electrodes changes by a greater ratio between when the magnetization directions of the spin-polarized electron injection layer and spin filter layer (the source and drain electrodes in the above-mentioned conventional spin transistors) are parallel and antiparallel. The resistance change ratio between the source and drain electrodes depends on the spin polarization ratio of electrons at the time of being injected from the source electrode into the semiconductor layer and then into the drain electrode.

In the conventional spin transistors, however, the spin-polarized electrons injected into the semiconductor layer from the source electrode are spin-dispersed before reaching the drain electrode, so as to reduce the spin polarization ratio, which makes it difficult for the resistance between the source and drain electrodes to change by a sufficiently large ratio between when the magnetization directions of the spin-polarized electron injection layer and spin filter layer are parallel and antiparallel.

Namely, the spin-polarized electrons passing through the semiconductor layer are spin-dispersed by electrons and the like within the semiconductor layer after traveling by a predetermined distance and thus lose their spin polarization information. The average distance by which the spin-polarized electrons advance until they lose the spin polarization information is referred to as spin-diffusion length. The spin-diffusion length drastically decreases when the electron density increases in a region where the spin-polarized electrons pass. In the conventional spin transistors, the spin-polarized electrons injected into the semiconductor layer from the source electrode reach the drain electrode after passing through a channel having a high electron density formed by applying a gate voltage. Therefore, the spin-polarized electrons injected into the semiconductor layer from the source electrode greatly reduce their spin polarization ratio before reaching the drain electrode, thereby lowering the ratio by which the resistance between the source and drain electrodes changes between when the magnetization directions of the spin-polarized electron injection layer and spin filter layer are parallel and antiparallel.

Such a problem can be alleviated by reducing the distance between the source and drain electrodes and thereby decreasing the channel length formed in the semiconductor layer. For reducing the distance between the source and drain electrodes, however, the conventional spin transistors have been limited in terms of fine processing techniques and thus have failed to solve the above-mentioned problem sufficiently.

In view of such a problem, it is an object of the present invention to provide a spin transistor in which the resistance between the source and drain electrodes changes by a sufficiently large ratio between when magnetization directions of a spin-polarized carrier injection layer and a spin filter layer are parallel and antiparallel, and a method of manufacturing such a spin transistor.

For solving the above-mentioned problem, the spin transistor in accordance with the present invention comprises a magnetoresistive element having a fixed layer, a free layer, and a semiconductor layer provided between the fixed layer and free layer; a source electrode layer electrically connected to one end face in a laminating direction of the magnetoresistive element; a drain electrode layer electrically connected to the other end face in the laminating direction of the magnetoresistive element; and a gate electrode layer laterally adjacent to the semiconductor layer through a gate insulating layer provided on a side face of the semiconductor layer.

When a voltage is applied to the gate electrode layer in the spin transistor in accordance with the present invention, a channel is formed within the semiconductor layer in response to this voltage, so that carriers flowing into the channel of the semiconductor layer through the fixed layer (or the free layer) from the source electrode layer increase. Therefore, functions similar to those of typical field-effect transistors can be exhibited. Here, the fixed layer (or the free layer) functions as a spin-polarized carrier injection layer, whereby carriers which are spin-polarized in the same direction as the magnetization direction of the fixed layer (or the free layer) are injected into the semiconductor layer.

The spin-polarized carriers injected in the semiconductor layer flow into the drain electrode layer through the free layer (or the fixed layer). Here, the free layer (or the fixed layer) functions as a spin filter layer, whereby the spin-polarized carriers injected in the semiconductor layer are subjected to spin-dependent scattering at the interface between the semiconductor layer and free layer (or the fixed layer).

Namely, when the magnetization direction of the spin-polarized carrier injection layer is opposite from that of the spin filter layer, the spin-polarized carriers injected in the semiconductor layer are mostly reflected at the interface between the semiconductor layer and spin filter layer and do not flow into the drain electrode layer. When the magnetization direction of the spin-polarized carrier injection layer is the same as that of the spin filter layer, on the other hand, the spin-polarized carriers injected in the semiconductor layer mostly pass through the interface between the semiconductor layer and spin filter layer, thereby flowing into the drain electrode layer. Therefore, the resistance value between the source and drain electrode layers varies between when the magnetization directions of the spin-polarized carrier injection layer and spin filter layer are parallel and antiparallel.

Since the gate electrode layer is laterally adjacent to the semiconductor layer through a gate insulating layer provided on a side face of the semiconductor layer, the channel length formed in the semiconductor layer is on a par with the thickness of the semiconductor layer in the spin transistor of the present invention. This lowers the probability of spin diffusion of spin-polarized carriers within the semiconductor layer into which they have been injected from the spin-polarized carrier injection layer, whereby carriers having a high spin polarization ratio reach the spin filter layer. Therefore, a spin transistor in which the resistance between the source and drain electrode layers changes by a sufficiently large ratio between when the magnetization directions of the spin-polarized carrier injection layer and spin filter layer are parallel and antiparallel can be obtained.

Preferably, a pair of gate electrode layers are provided so as to laterally hold the semiconductor layer therebetween. This makes it possible to form two channels in the semiconductor layer by applying a voltage between the pair of gate electrode layers. As a result, a spin transistor in which the resistance between the source and drain electrode layers changes by a greater ratio between when the magnetization directions of the spin-polarized carrier injection layer and spin filter layer are parallel and antiparallel can be obtained.

Preferably, the spin transistor in accordance with the present invention further comprises gate voltage applying means for applying a voltage to the gate electrode layer, and drain voltage applying means for applying a voltage to the drain electrode layer. This can yield a spin transistor to which the gate voltage and drain voltage can easily be applied.

Preferably, the fixed layer includes first and second ferromagnetic layers laminated with a nonmagnetic layer interposed therebetween, while the first and second ferromagnetic layers are exchange-coupled so as to have respective magnetization directions antiparallel to each other. This makes the magnetization direction of the fixed layer more stable, whereby operations of the spin transistor can be stabilized.

Preferably, the spin transistor in accordance with the present invention is adapted to reverse the magnetization direction of the free layer when a current flows through the magnetoresistive element in the laminating direction thereof. This can yield a spin transistor which can change its output characteristic by simply causing a current to flow through the magnetoresistive element. Since no mechanisms for reversing the magnetization direction of the free layer by external magnetic fields are necessary, the spin transistor can be made smaller. When two states where the magnetization directions of the free layer and fixed layer are parallel and antiparallel are assigned to one bit, a spin transistor usable as a nonvolatile semiconductor memory can be obtained.

Preferably, the semiconductor layer has a thickness of 1 to 30 nm. In this case, the spin-polarized carriers injected in the semiconductor layer are substantially kept from effecting spin diffusion within the semiconductor layer, so as to be subjected to ballistic conduction from the spin-polarized carrier injection layer to the spin filter layer. As a consequence, the carriers reaching the spin filter layer can attain a higher spin polarization ratio, whereby a spin transistor in which the resistance between the source and drain electrode layers changes by a greater ratio between when the magnetization directions of the spin-polarized carrier injection layer and spin filter layer are parallel and antiparallel can be obtained. Since the semiconductor layer has a thickness of 1 nm or greater, no drain current flows when no voltage is applied to the gate electrode layer, whereby the function of the spin transistor as a field-effect transistor is kept.

Preferably, the semiconductor layer contains at least one species selected from the group consisting of Si, Ge, and ZnO.

Preferably, at least one of the free layer and fixed layer is in Schottky contact with the semiconductor layer. This can reduce the probability of spin diffusion of spin-polarized carriers at the time when they pass through the interface between the free layer and semiconductor layer and the interface between the fixed layer and semiconductor layer. As a result, a spin transistor in which the resistance between the source and drain electrode layers changes by a greater ratio between when the magnetization directions of the spin-polarized carrier injection layer and spin filter layer are parallel and antiparallel can be obtained.

Preferably, the magnetoresistive element further comprises a tunnel barrier layer provided in at least one of gaps between the free layer and semiconductor layer and between the fixed layer and semiconductor layer. This can reduce the probability of spin diffusion of spin-polarized carriers at the time when they pass between the free layer and semiconductor layer and between the fixed layer and semiconductor layer. As a result, a spin transistor in which the resistance between the source and drain electrode layers changes by a greater ratio between when the magnetization directions of the spin-polarized carrier injection layer and spin filter layer are parallel and antiparallel can be obtained.

The method of manufacturing a spin transistor in accordance with the present invention comprises the steps of forming a first electrode layer; forming a magnetoresistive element having a fixed layer, a free layer, and a semiconductor layer provided between the fixed layer and free layer such that one end face in a laminating direction of the magnetoresistive element is electrically connected to the first electrode layer; forming a gate insulating layer on a side face of the semiconductor layer; forming a gate electrode layer laterally adjacent to the semiconductor layer through the gate insulating layer; and forming a second electrode layer electrically connected to the other end face in the laminating direction of the magnetoresistive element.

The method of manufacturing a spin transistor in accordance with the present invention can yield a field-effect transistor in which one of the first and second electrode layers is a source electrode layer, while the other is a drain electrode layer. When a voltage is applied to the gate electrode layer, a channel is formed within the semiconductor layer, so that carriers flowing into the channel of the semiconductor layer through the fixed layer (or the free layer) from the source electrode layer increase. Therefore, functions similar to those of typical field-effect transistors can be exhibited. Here, the fixed layer (or the free layer) functions as a spin-polarized carrier injection layer, whereby carriers which are spin-polarized in the same direction as the magnetization direction of the fixed layer (or the free layer) are injected into the semiconductor layer.

The spin-polarized carriers injected in the semiconductor layer flow into the drain electrode layer through the free layer (or the fixed layer). Here, the free layer (or the fixed layer) functions as a spin filter layer, whereby the spin-polarized carriers injected in the semiconductor layer are subjected to spin-dependent scattering at the interface between the semiconductor layer and free layer (or the fixed layer).

Namely, when the magnetization direction of the spin-polarized carrier injection layer is opposite from that of the spin filter layer, the spin-polarized carriers injected in the semiconductor layer are mostly reflected at the interface between the semiconductor layer and spin filter layer and do not flow into the drain electrode layer much. When the magnetization direction of the spin-polarized carrier injection layer is the same as that of the spin filter layer, on the other hand, the spin-polarized carriers injected in the semiconductor layer mostly pass through the interface between the semiconductor layer and spin filter layer, thereby flowing into the drain electrode layer. Therefore, the resistance value between the source and drain electrode layers varies between when the magnetization directions of the spin-polarized carrier injection layer and spin filter layer are parallel and antiparallel.

Since the gate electrode layer is laterally adjacent to the semiconductor layer through a gate insulating layer provided on a side face of the semiconductor layer, the channel length formed in the semiconductor layer is on a par with the thickness of the semiconductor layer in the spin transistor obtained by the method of manufacturing a spin transistor in accordance with the present invention. The thickness of the semiconductor layer can easily be controlled by film-forming conditions at the time of forming the semiconductor layer and can be reduced. Therefore, the channel length can be made shorter than in the conventional spin transistors in which the reduction of channel length is restricted by fine processing techniques. This can lower the probability of spin diffusion of spin-polarized carriers within the semiconductor layer into which they have been injected from the spin-polarized carrier injection layer, whereby carriers having a high spin polarization ratio can reach the spin filter layer. As a result, a spin transistor in which the resistance between the source and drain electrode layers changes by a sufficiently large ratio between when the magnetization directions of the spin-polarized carrier injection layer and spin filter layer are parallel and antiparallel can be obtained.

The present invention can provide a spin transistor in which the resistance between the source and drain electrodes changes by a sufficiently large ratio between when the magnetization directions of the spin-polarized carrier injection layer and spin filter layer are parallel and antiparallel, and a method of manufacturing such a spin transistor.

BRIEF DESCRIPTION OF THE DRAWINGS

FIG. 10A is a plan view of an intermediate of the spin transistor 30;
FIG. 10B is an end view of an intermediate of the spin transistor 30;
FIG. 11A is a plan view of an intermediate of the spin transistor 30;
FIG. 11B is an end view of an intermediate of the spin transistor 30;
FIG. 14A is a plan view of an intermediate of the spin transistor 30;
FIG. 14B is an end view of an intermediate of the spin transistor 30;
FIG. 15A is a plan view of an intermediate of the spin transistor 30;
FIG. 15B is an end view of an intermediate of the spin transistor 30;
FIG. 16A is a plan view of an intermediate of the spin transistor 30;
FIG. 16B is an end view of an intermediate of the spin transistor 30;
FIG. 16C is an end view of an intermediate of the spin transistor 30;
FIG. 16D is an end view of an intermediate of the spin transistor 30.

DESCRIPTION OF THE PREFERRED EMBODIMENTS

Figure 1:
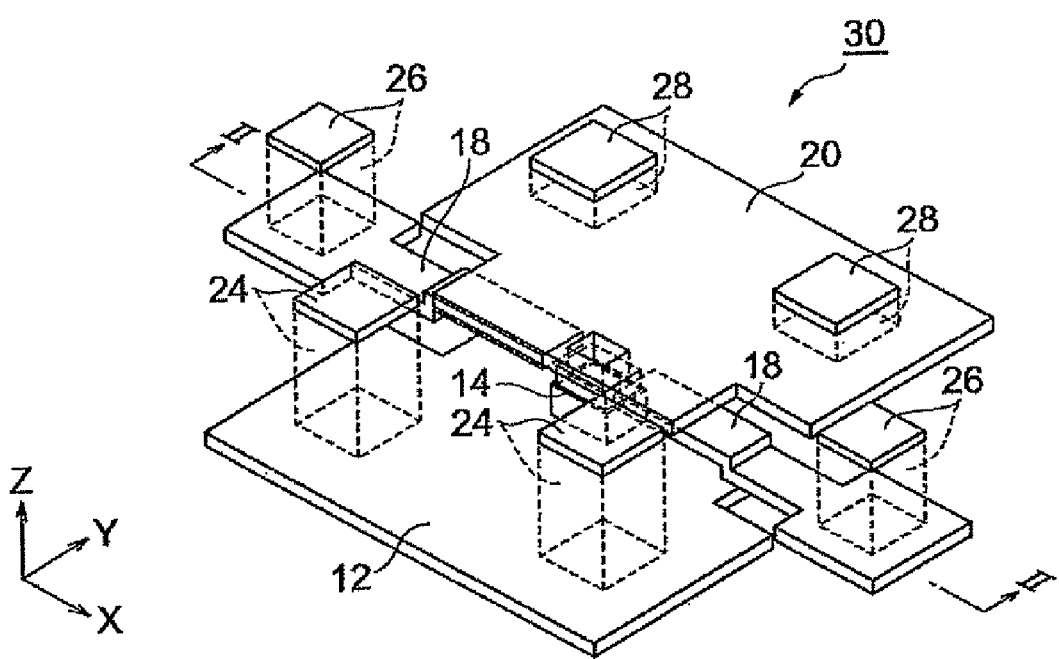
FIG. 1 is a perspective view of a spin transistor 30 in accordance with an embodiment.

In the following, a spin transistor in accordance with an embodiment and a method of manufacturing the same will be explained in detail with reference to the accompanying drawings. In the drawings, the same constituents will be referred to with the same numerals or letters while omitting their overlapping descriptions. For easier viewing of the drawings, dimensional ratios within and among constituents in the drawings are arbitrary.

Figure 2:
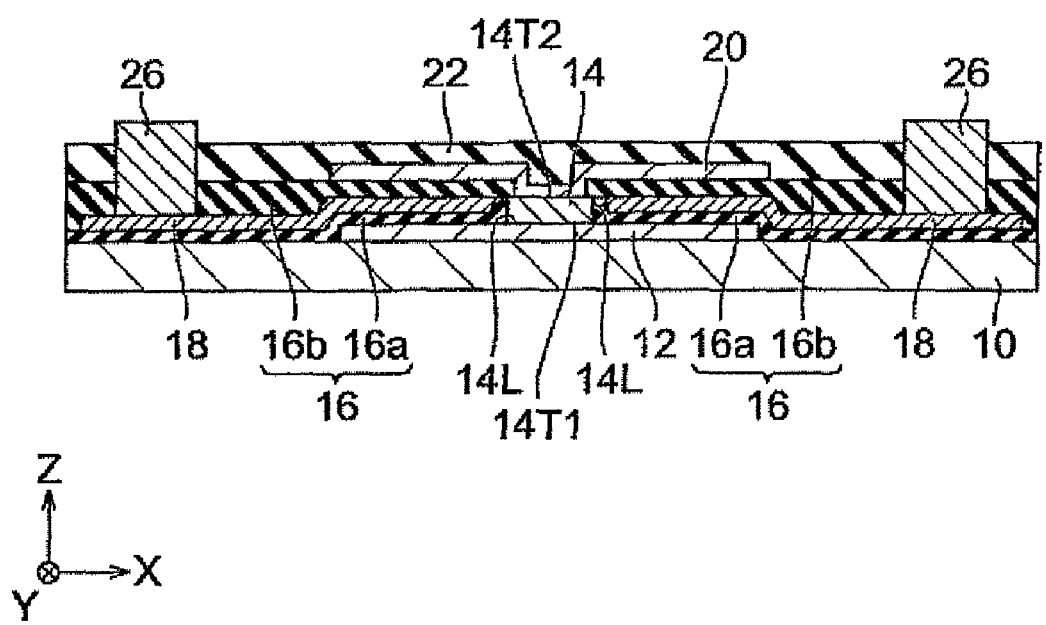
FIG. 2 is a sectional view of the spin transistor 30 taken along the line II-II of FIG. 1.

FIG. 1 is a perspective view of a spin transistor 30 in accordance with an embodiment, whereas FIG. 2 is a sectional view of the spin transistor 30 taken along the line II-II of FIG. 1. For easier viewing of the drawings, a silicon substrate 10, a gate insulating layer 16, and a protective layer 22 in FIG. 2 are not depicted in FIG. 1.

As shown in FIGS. 1 and 2, the spin transistor 30 comprises a magnetoresistive element 14 having a laminating direction along the Z axis, a source electrode layer 12 electrically connected to one end face 14T1 in the laminating direction of the magnetoresistive element 14, a drain electrode layer 20 electrically connected to the other end face 14T2 in the laminating direction of the magnetoresistive element 14, and gate electrode layers 18 laterally adjacent to the magnetoresistive element 14 through the gate insulating layer 16 provided on side faces 14L of the magnetoresistive element 14.

The magnetoresistive element 14 is a element having a magnetoresistive effect, in which a plurality of layers are laminated along the Z axis as will be explained later. The source electrode layer 12 and drain electrode layer 20 are planar electrode layers having respective projections along the Y axis, while the magnetoresistive element 14 is arranged between the projections extending along the Y axis. The drain electrode layer 20 has a depression and a projection which extend along the Z axis, while the projection extending along the Z axis is in contact with the other end face 14T2 in the laminating direction of the magnetoresistive element 14. The source electrode layer 12 and drain electrode layer 20 are formed from a metal such as Cu, for example, and electrically connected to the magnetoresistive element 14. The source electrode layer 12 and drain electrode layer 20 are not limited to such a form, but may have a rectangular form or the like as seen along the Z axis. The drain electrode layer 20 may be free of the depression and projection extending along the Z axis, as long as it is electrically insulated from the gate electrode layers 18 as will be explained later.

As shown in FIG. 2, the source electrode layer 12, magnetoresistive element 14, and drain electrode layer 20 are successively laminated on the silicon substrate 10. The gate insulating layer 16 is provided on the side face 14L of the magnetoresistive element 14, i.e., the side face 14L intersecting a line orthogonal to the laminating direction of the magnetoresistive element 14. The gate insulating layer 16 is constituted by a lower gate insulating layer 16a for electrically insulating the gate electrode layer 18 from the silicon substrate 10, source electrode layer 12, and magnetoresistive element 14 and an upper gate insulating layer 16b for electrically insulating the gate electrode layer 18 from the drain electrode layer 20. Each of the lower and upper gate insulating layers 16a, 16b is formed from an insulator such as $SiO_2$. Here, the terms "upper" and "lower" refer to relative positions on the positive and negative sides of the Z axis, respectively, and are unrelated to the direction of gravity.

A pair of gate electrode layers 18 are provided laterally adjacent to the magnetoresistive element 14, i.e., adjacent to the magnetoresistive element 14 in a direction orthogonal to the laminating direction of the magnetoresistive element 14, through the gate insulating layer 16. The gate electrodes 18 are formed from a material similar to that of the source electrode layer 12 and drain electrode layer 20.

The protective layer 22 made of an insulator such as $SiO_2$ is formed so as to cover the drain electrode layer 20 and upper gate insulating layer 16b.

As shown in FIGS. 1 and 2, the source electrode layer 12, drain electrode layer 20, and gate electrode layers 18 are provided with their corresponding pairs of source electrode layer pads 24, drain electrode layer pads 28, and gate electrode layer pads 26 in electric contact therewith. Each of the source electrode layer pads 24, drain electrode layer pads 28, and gate electrode layer pads 26 has a part projected to the outside of the protective layer 22, while the rest is buried within the protective layer 22.

Therefore, applying a voltage between the gate electrode layer pad 26 and source electrode layer pad 24 can impart a gate voltage to the spin transistor 30. Similarly, applying a voltage between the drain electrode layer pad 28 and source electrode layer pad 24 can impart a drain voltage to the spin transistor 30. Namely, the gate electrode layer pad 26 and source electrode layer pad 24 construct gate voltage applying means, while the drain electrode layer pad 28 and source electrode layer pad 24 construct drain voltage applying means.

In FIG. 1, the parts of the source electrode layer pads 24, drain electrode layer pads 28 and gate electrode layer pads 26 buried within the protective layer 22 are illustrated by broken lines. Though the source electrode layer 12 and drain electrode layer 20 are provided with two electrode layer pads 24 or two drain electrode layer pads 28, their number may be one or three or more.

Figure 3:
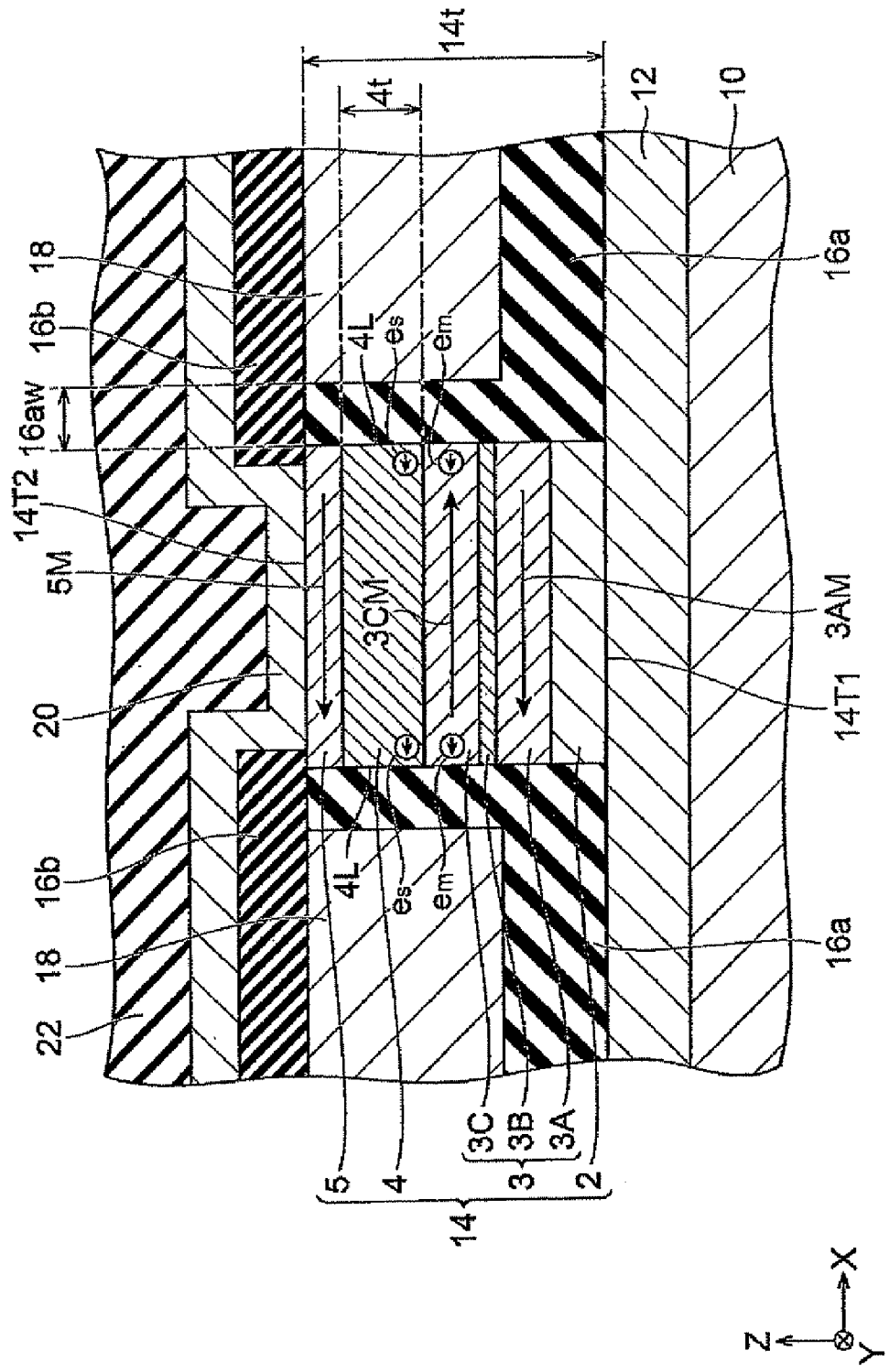
FIG. 3 is an enlarged sectional view of a magnetoresistive element 14 and its vicinity in FIG. 2.

The structure of the magnetoresistive element 14 and its vicinity will now be explained in detail with reference to FIG. 3. FIG. 3 is an enlarged sectional view of a magnetoresistive element 14 and its vicinity in FIG. 2.

As shown in FIG. 3, the magnetoresistive element 14 has a fixed layer 3, a free layer 5, and a semiconductor layer 4 provided between the fixed layer 3 and free layer 5. Specifically, the magnetoresistive element 14 is one in which an antiferromagnetic layer 2 in contact with the source electrode layer 12, a lower ferromagnetic layer 3A (first ferromagnetic layer) exchange-coupled to the antiferromagnetic layer 2 so as to have a magnetization direction 3AM fixed to the positive direction along the X axis, a nonmagnetic layer 3B made of a conductive metal such as Ru, an upper ferromagnetic layer 3C (second ferromagnetic layer) having a magnetization direction 3CM fixed through the nonmagnetic layer 3B to a direction (the negative direction along the X axis) opposite from the magnetization direction 3AM of the lower ferromagnetic layer 3A, the semiconductor layer 4 in Schottky contact with the upper ferromagnetic layer 3C, and the free layer 5 constituted by a ferromagnetic material in Schottky contact with the semiconductor layer 4 are successively laminated. The magnetoresistive element 14 has a thickness 14t within the range of 20 to 100 nm, for example, though not restricted in particular. A foundation layer made of Ta or the like may be inserted between the antiferromagnetic layer 2 and source electrode layer 12, while a cap layer made of Ta or the like may be inserted between the free layer 5 and drain electrode layer 20.

The ferromagnetism is the magnetism of a material having a large magnetic moment as a whole in which adjacent spins are aligned in the same direction. A ferromagnetic substance has spontaneous magnetism even when there is no external magnetic field. Examples of materials exhibiting ferromagnetism at room temperature include Fe, Co, Ni, and Gd. Co, Ni—Fe alloys, Co—Fe alloys, and the like can be used favorably as ferromagnetic materials constituting the lower ferromagnetic layer 3A, upper ferromagnetic layer 3C, and free layer 5. Preferably employable from the viewpoint of enhancing the spin-polarized carrier injecting function or spin filter function as will be explained later are half metals whose spin polarization ratio at room temperature is substantially 100%, specific examples of which include Heusler alloys such as NiMnSb and CoMnSi, sphalerite compounds such as CrAs and CrSb, and perovskite compounds such as $La_{0.7}Sr_{0.3}MnO_3$. Usable as the antiferromagnetic substance constituting the antiferromagnetic layer 2 are FeMn, IrMn, PtMn, NiMn, and the like.

Si, Ge, ZnO, or one containing at least one species selected from the group consisting of these materials can be used favorably as the material constituting the semiconductor layer 4. The conduction type of the semiconductor layer 4 can be any of n and p. From the viewpoint of sufficiently reducing the channel length as will be explained later, the semiconductor layer 4 has a thickness 4t preferably falling within the range of 1 to 30 nm, more preferably 1 to 20 nm.

The gate insulating layer 16 is provided on side faces 4L of the semiconductor layer 4 which are pan of the side faces 14L of the magnetoresistive element 14, i.e., the side faces 4L intersecting a line orthogonal to the laminating direction of the semiconductor layer 4.

A pair of gate electrode layers 18 are provided laterally adjacent to the semiconductor layer 4, i.e., adjacent to the semiconductor layer 4 in a direction orthogonal to the laminating direction of the semiconductor layer 4, through the gate insulating layer 16. The width 16aw of the lower gate insulating layer 16a, i.e., the distance 16aw between the semiconductor layer 4 and gate electrode layer 18, is such a size as to form a channel within the semiconductor layer 4 when a voltage is applied between the gate electrode layer 18 and source electrode layer 12 as will be explained later, e.g., 1 to 10 nm.

Operations of the spin transistor 30 in the embodiment shown in FIG. 1 will now be explained.

Figure 4:
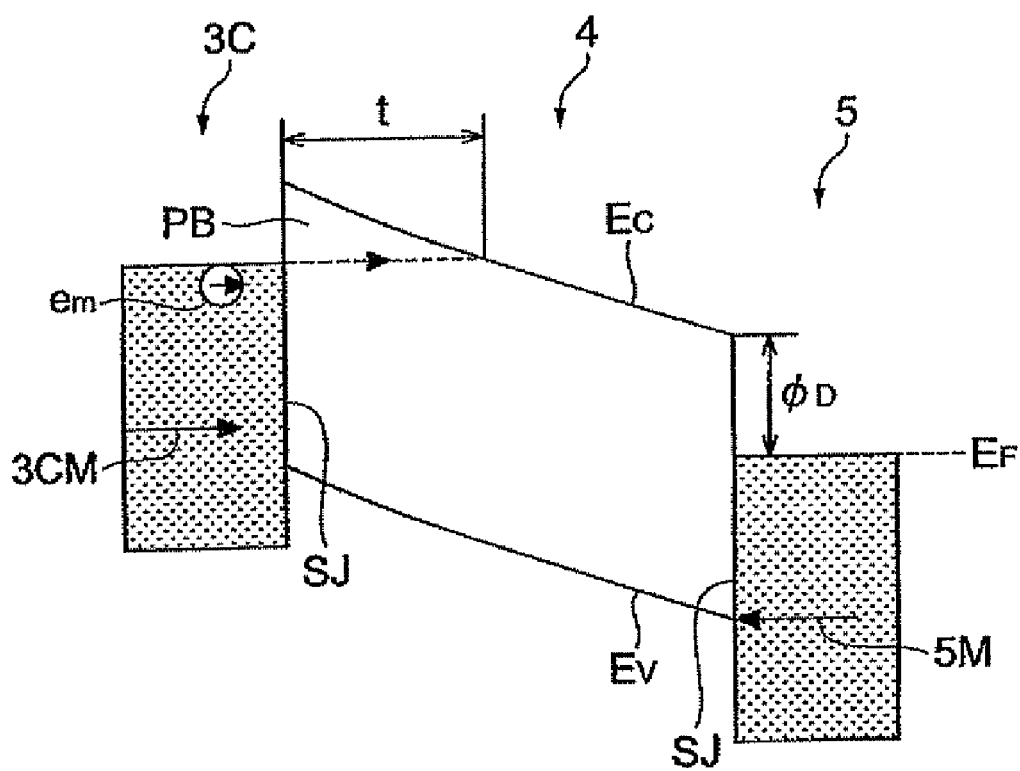
FIG. 4 is an energy-band diagram of the spin transistor 30.

FIG. 4 is an energy-band diagram of the semiconductor layer 4 adjacent to the gate electrode layer 18 through the gate insulating layer 16, the upper ferromagnetic layer 3C arranged between the semiconductor layer 4 and source electrode layer 12, and the free layer 5 arranged between the semiconductor layer 4 and drain electrode layer 20, which are shown in FIGS. 2 and 3. This diagram shows a case where the conduction of the semiconductor layer 4 is of n-type, no voltage is applied to the gate electrode layer 18, and a voltage is applied to the drain electrode layer 20. The application of a voltage to the drain electrode layer 20 refers to application of a voltage between the drain electrode layer 20 and source electrode layer 12 through the drain electrode layer pad 28 and source electrode layer pad 24 (see FIGS. 1 to 3). In the energy-band diagram, the energy increases along the positive vertical direction, while the potential increases along the negative vertical direction.

An electron em injected from the source electrode layer 12 into the upper ferromagnetic layer 3C constituted by a ferromagnetic material has a polarized spin in the same direction (though the electron has a negative polarity) as the magnetization direction 3CM of the upper ferromagnetic layer 3C. A potential barrier (depletion layer) PB formed by the Schottky contact SJ between the upper ferromagnetic layer 3C and semiconductor layer 4 has a thickness t greater than the thickness by which a tunneling effect occurs, whereby the electron em within the upper ferromagnetic layer 3C is not injected into the semiconductor layer 4. In this diagram, Ec indicates the energy level of the lower end of the conduction band in the semiconductor layer 4, while Ev shows the energy level of the upper end of the valence band therein.

Figure 5:
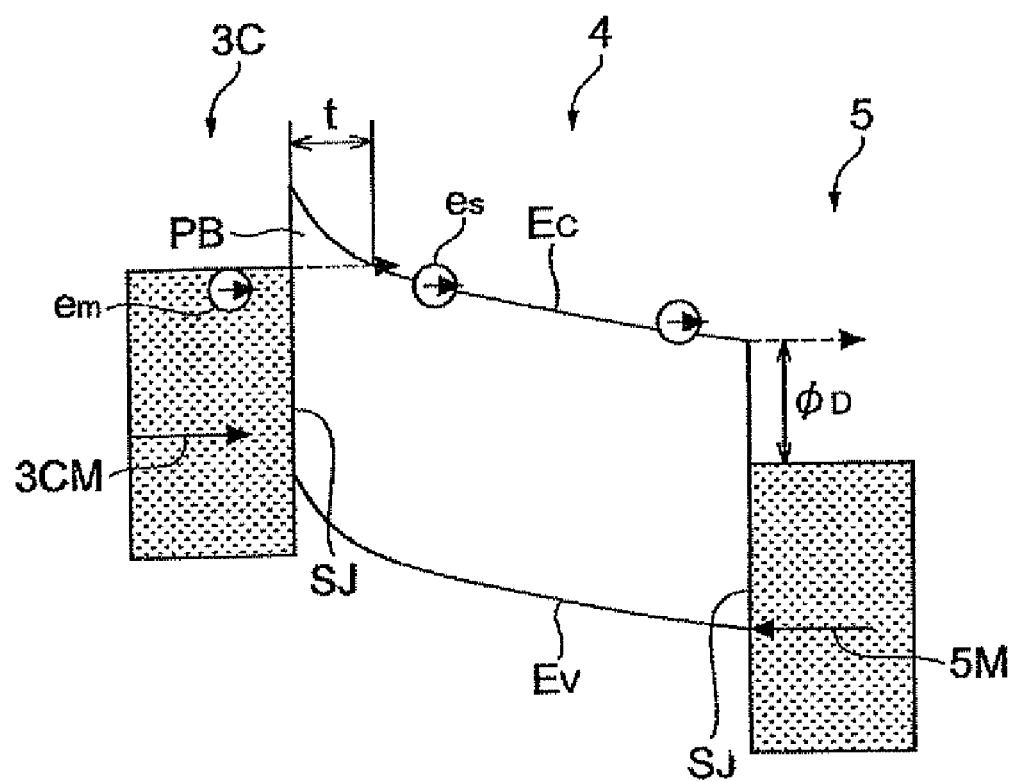
FIG. 5 is an energy-band diagram of the spin transistor 30.

FIG. 5 is an energy-band diagram at the same location as that of FIG. 4. FIG. 5 shows a case where voltages are applied to the gate electrode layer 18 and drain electrode layer 20. The application of a voltage to the gate electrode layer 18 refers to application of a voltage between the gate electrode layer 18 and source electrode layer 12 through the gate electrode layer pad 26 and source electrode layer pad 24 (see FIGS. 1 to 3).

When a positive potential is applied to the gate electrode layer 18 in FIGS. 1 to 3, an n-type channel is formed in response to this positive potential in a part adjacent to the gate electrode layer 18 within the semiconductor layer 4. Namely, an n-type channel is formed within the semiconductor layer 4 in its thickness direction. Simultaneously with the forming of the channel, the thickness t of the potential barrier PB formed by the Schottky contact SJ between the upper ferromagnetic layer 3C and semiconductor layer 4 decreases, whereby a greater number of electrons es flow into the channel of the semiconductor layer 4. Thus, whether there is a gate voltage or not can control the number of electrons flowing from the source electrode layer 12 into the channel of the semiconductor layer 4 through the upper ferromagnetic layer 3C, whereby the spin transistor 30 in this embodiment exhibits functions similar to those of typical field-effect transistors.

The electrons es injected into the semiconductor layer 4 from the upper ferromagnetic layer 3C as mentioned above are spin-polarized in the same direction as the upper ferromagnetic layer 3C. Namely, the fixed layer 3 functions as the spin-polarized carrier injection layer 3 for injecting the electrons spin-polarized in the same direction as the upper ferromagnetic layer 3C in contact with the semiconductor layer 4 into the semiconductor layer 4. The ratio between the state density of electrons whose spin is parallel to the magnetization direction 3CM and the state density of electrons whose spin is antiparallel thereto equals the ratio between the number of electrons parallel the magnetization direction 3CM and the number of electrons antiparallel thereto. While the fixed layer 3 has two ferromagnetic layers of the upper ferromagnetic layer 3C and lower ferromagnetic layer 3A, the fixed layer 3 injects the electrons spin-polarized in the same direction as the upper ferromagnetic layer 3 into the semiconductor layer 4. Therefore, the magnetization direction of the spin-polarized carrier injection layer 3 refers to the magnetization direction 3CM of the upper ferromagnetic layer 3C in contact with the semiconductor layer 4.

When the magnetization direction 3CM of the upper ferromagnetic layer 3C is opposite from the magnetization direction 5M of the free layer 5 as shown in FIG. 5, the spin-polarized electrons es injected in the semiconductor layer 4 are mostly reflected at the interface between the semiconductor layer 4 and free layer 5 because of the magnetoresistive effect, and thus do not flow into the drain electrode layer 20 much.

Figure 6:
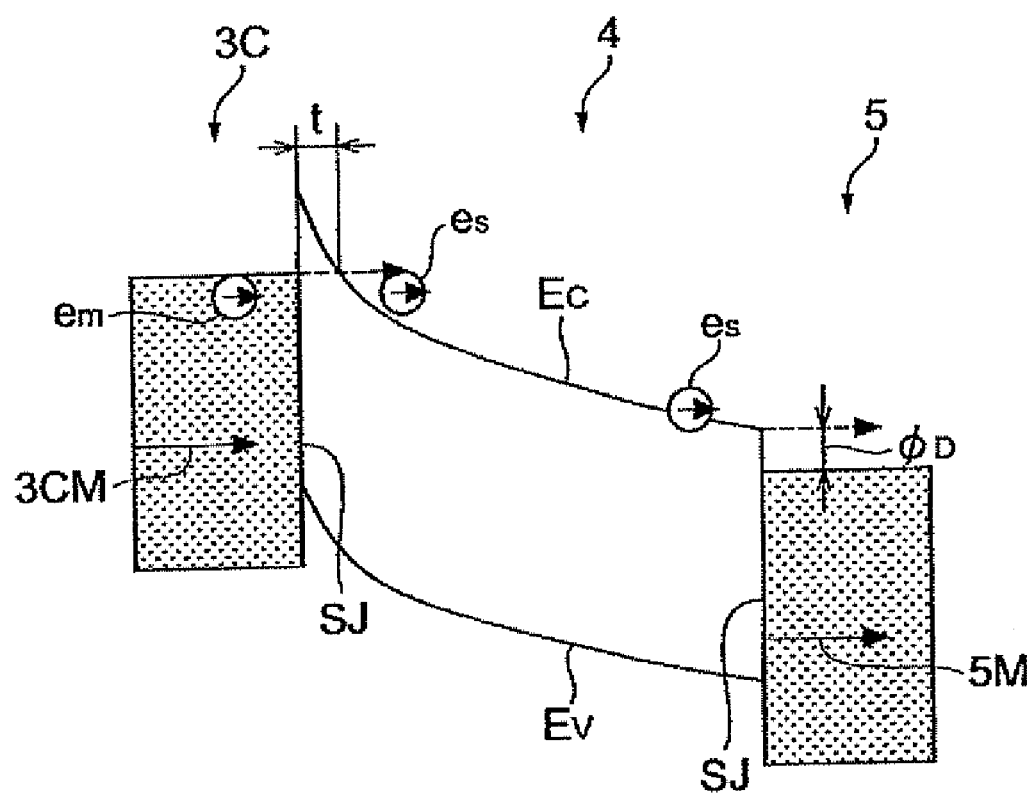
FIG. 6 is an energy-band diagram of the spin transistor 30.

A case where the magnetization direction 5M of the free layer 5 is reversed so as to become the same direction as the magnetization direction 3CM of the upper ferromagnetic layer 3C will now be explained with reference to FIG. 6. FIG. 6 is an energy-band diagram at the same location as that of FIG. 4. FIG. 6 shows a state where voltages are applied to the gate electrode layer 18 and drain electrode layer 20, while the magnetization direction 5M of the free layer 5 is reversed so as to become the same direction as the magnetization direction 3CM of the upper ferromagnetic layer 3C.

In the state shown in FIG. 6, the magnetization direction 3CM of the upper ferromagnetic layer 3C is the same as the magnetization direction 5M of the free layer 5, whereby the electrons es injected in the semiconductor layer 4 mostly flow into the drain electrode layer 20 without being reflected at the interface between the semiconductor layer 4 and free layer 5 because of the magnetoresistive effect.

The ferromagnetic material constituting the free layer 5 has spontaneous magnetism, thereby yielding a magnetic moment even when there is no external magnetic field. Energy varies between the state of an electron having a spin parallel to the magnetic moment and the state of an electron having a spin antiparallel thereto. Therefore, the number of conducted electrons varies depending on the direction of spin.

The magnetoresistive effect occurs when the spin-polarized electrons es flow into the free layer 5 from the semiconductor layer 4 as mentioned above. Specifically, when the spin-polarized electrons es migrate to the drain electrode layer 20 through the interface between the semiconductor layer 4 and free layer 5, the probability of the spin-polarized electrons es passing through the interface between the semiconductor layer 4 and free layer 5 varies depending on the relative orientation between the spin direction of the spin-polarized electrons es and the magnetization direction of the free layer 5. Therefore, the free layer 5 functions as the spin filter layer 5 that preferentially transmits therethrough the electrons spin-polarized in the same direction as its magnetization direction 5M.

Since the polarization direction of the spin-polarized electrons es is determined by the magnetization direction 3CM of the upper ferromagnetic layer 3C, the resistance value between the source electrode layer 12 and drain electrode layer 20 varies between when the magnetization directions 3CM and 5M of the spin-polarized carrier injection layer 3 (fixed layer 3) and spin filter layer 5 (free layer 5) are parallel and antiparallel even at the gate voltage value. As the spin-polarized electrons es injected in the semiconductor layer 4 attain a higher spin polarization ratio at the time of reaching the spin filter layer 5, the resistance between the source electrode layer 12 and drain electrode layer 20 changes by a greater ratio between when the magnetization directions of the spin-polarized carrier injection layer 3 and spin filter layer 5 are parallel and antiparallel.

As in the foregoing, the upper ferromagnetic layer 3C is a ferromagnetic metal, the conduction type of the semiconductor layer 4 is n, and the work function ϕm of the ferromagnetic metal and the work function ϕs of the semiconductor layer 4 satisfy the relationship of ϕm>ϕs in the above-mentioned spin transistor 30.

Namely, the upper ferromagnetic layer 3C and the semiconductor layer 4 form the Schottky contact SJ therebetween, while the thickness t of the potential barrier formed by the Schottky contact SJ can be reduced to a thickness at which a tunneling effect occurs or lower in response to the potential applied to the gate electrode layer 18.

When the work functions satisfy the relationship of ϕm>ϕs, the potential barrier PB is formed like a spike between the upper ferromagnetic layer 3C and semiconductor layer 4. In an equilibrium state (FIG. 4), the potential barrier PB makes it difficult for the electrons em to flow into the semiconductor layer 4 from the upper ferromagnetic layer 3C until a positive potential is applied to the gate electrode layer 18. When the gate potential is raised (FIGS. 5 and 6), the semiconductor layer 4 reduces its energy in response to the applied potential, so that the thickness t of the spike-shaped potential barrier PB decreases, whereby the electrons em flow into the semiconductor layer 4 from the upper ferromagnetic layer 3C because of the tunneling effect.

Referring to FIGS. 4 to 6, there is a potential difference ϕD between the Fermi level $E_F$ of the metal constituting the free layer 5 and the lower end of the conduction band Ec of the semiconductor layer 4 adjacent thereto. When the gate voltage is applied, the energy band of the semiconductor layer 4 bends, so that the potential barrier PB becomes thinner, which allows the electrons em to tunnel from the upper ferromagnetic layer 3C to the conduction band of the semiconductor layer 4, whereby a current flows through the spin transistor 30. When the free layer 5 is in an ideal state with no diffusive conduction or no scattering at all, the electrons em migrate from the semiconductor layer 4 to the free layer 5 by ballistic conduction, thereby defining the potential difference ϕD at the interface between the free layer 5 and semiconductor layer 4.

By causing a current to flow through the magnetoresistive element 14 in the laminating direction thereof, the above-mentioned spin transistor 30 can reverse the magnetization direction 5M of the free layer 5 by the following principle. When a current flows through the magnetoresistive element 14 in the direction from the positive side to negative side of the Z axis in FIG. 3, spin-polarized electrons are injected into the free layer 5 from the upper ferromagnetic layer 3C through the semiconductor layer 4. When the magnetization direction 3CM of the upper ferromagnetic layer 3C and the magnetization direction 5M of the free layer 5 are antiparallel, the spin-polarized electrons es within the semiconductor layer 4 are mostly scattered by the interface between the semiconductor layer 4 and free layer 5, but partly injected into the free layer 5. Then, the magnetization direction 5M of the free layer 5 receives such a torque that it rotates so as to become parallel to the magnetization direction 3CM of the upper ferromagnetic layer 3C. When this torque has a predetermined magnitude or greater, the magnetization direction 5M of the free layer 5 is reversed so as to become parallel to the magnetization direction 3CM of the upper ferromagnetic layer 3C.

For reversing the magnetization direction 5M of the free layer 5 thereafter so as to become antiparallel to the magnetization direction 3CM of the upper ferromagnetic layer 3C, the polarity of the current to flow through the magnetoresistive element 14 is reversed. In this case, electrons polarized in the same direction as the upper ferromagnetic layer 3C preferentially flow into the upper ferromagnetic layer 3C. Then, electrons polarized in the direction opposite from that of the upper ferromagnetic layer 3C remain within the free layer 5. From the latter electrons, the magnetization direction 5M of the free layer 5 receives such a torque that it is rotated so as to become antiparallel to the magnetization direction 3CM of the upper ferromagnetic layer 3C. When this torque has a predetermined magnitude or greater, the magnetization direction 5M of the free layer 5 is reversed so as to become antiparallel to the magnetization direction 3CM of the upper ferromagnetic layer 3C.

Whether or not the magnetization direction 5M of the free layer 5 can be reversed by causing a current to flow through the magnetoresistive element 14 in practice depends on the magnitude of torque received by the magnetization direction 5M of the free layer 5, the material and form of the free layer 5, and the like. The magnitude of torque depends on the level of current flowing through the magnetoresistive element 14, the spin polarization ratio of electrons traveling the free layer 5 and fixed layer 3, and the like. These conditions are appropriately adjusted in the spin transistor 30 in accordance with this embodiment, so that the magnetization direction 5M of the free layer 5 can be reversed by causing a current to flow through the magnetoresistive element 14.

A case where the conduction of the semiconductor layer 4 is of p-type will now be explained. The structure of the spin transistor 30 in this case is the same as that shown in FIG. 1 and the like.

Figure 7:
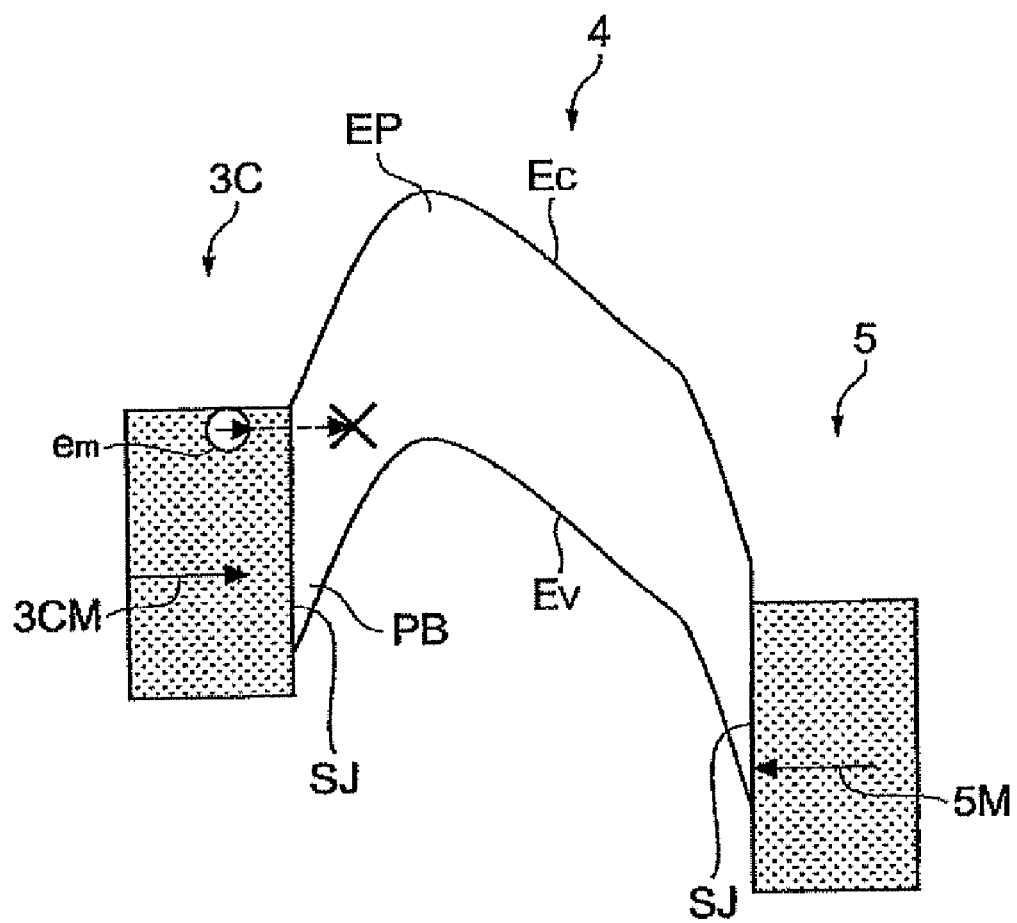
FIG. 7 is an energy-band diagram of the spin transistor 30.

FIG. 7 is an energy-band diagram of the semiconductor layer 4 adjacent to the gate electrode layer 18 through the gate insulating layer 16, the upper ferromagnetic layer 3C arranged between the semiconductor layer 4 and source electrode layer 12, and the free layer 5 arranged between the semiconductor layer 4 and drain electrode layer 20, which are shown in FIGS. 2 and 3. This diagram shows a case where the conduction of the semiconductor layer 4 is of p-type, no voltage is applied to the gate electrode layer 18, and a voltage is applied to the drain electrode layer 20.

The upper ferromagnetic layer 3C and the semiconductor layer 4 form the Schottky contact SJ at their interface. When no gate voltage is applied, holes within the semiconductor layer 4 are not injected into any of the upper ferromagnetic layer 3C and free layer 5, so that the electrons em within the upper ferromagnetic layer 3C cannot surpass the bent peak of the energy band of the semiconductor layer 4 and thus are not injected into the semiconductor layer 4.

Figure 8:
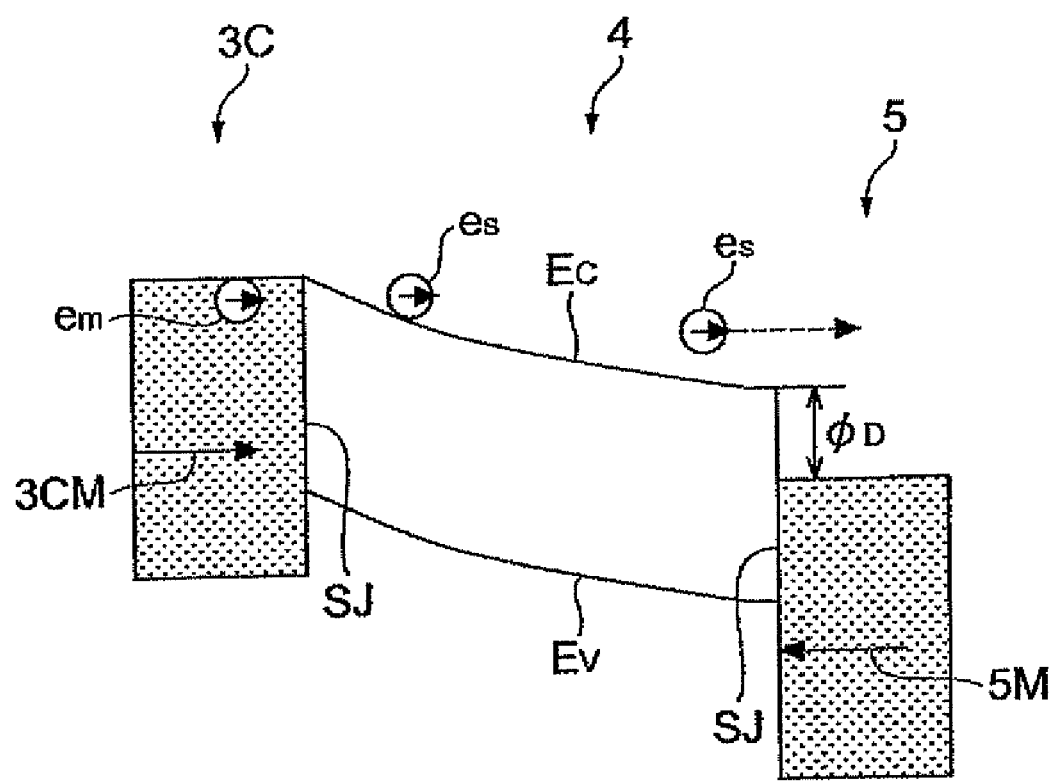
FIG. 8 is an energy-band diagram of the spin transistor 30.

FIG. 8 is an energy-band diagram at the same location as that of FIG. 7. FIG. 8 shows a case where voltages are applied to the gate electrode layer 18 and drain electrode layer 20.

When a positive potential is applied to the gate electrode layer 18 in FIGS. 1 to 3, an n-type channel is formed in response to this positive potential in a part adjacent to the gate electrode layer 18 within the semiconductor layer 4. Namely, an n-type channel is formed within the semiconductor layer 4 in its thickness direction. Simultaneously with the forming of the channel, the energy band peak height (energy) of the semiconductor layer 4 decreases, so that the electrons em within the upper ferromagnetic layer 3C are injected into the semiconductor layer 4. Since the ferromagnetic layer 3 is made of a ferromagnetic substance, the electrons es injected into the semiconductor layer 4 from the upper ferromagnetic layer 3C have a unidirectional spin.

When the magnetization direction 5M of the free layer 5 is opposite from the magnetization direction 3CM of the upper ferromagnetic layer 3C, the electrons es are mostly reflected by the interface between the semiconductor layer 4 and free layer 5 because of the magnetoresistive effect, and thus do not flow into the free layer 5 much.

Figure 9:
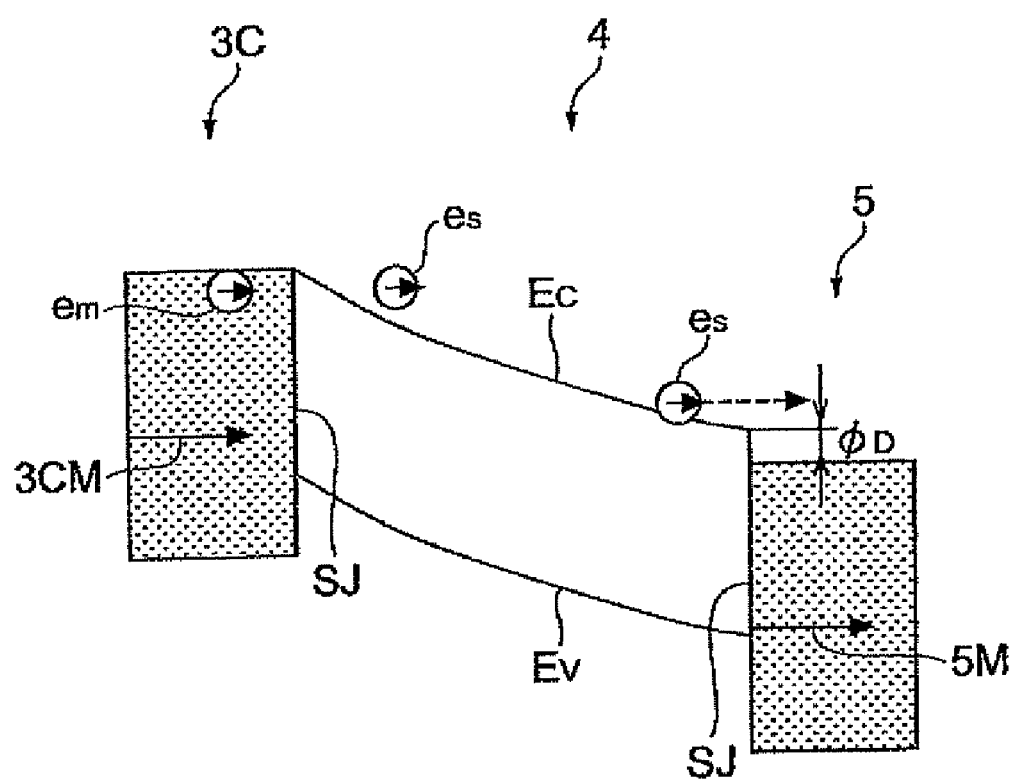
FIG. 9 is an energy-band diagram of the spin transistor 30.

A case where the magnetization direction 5M of the free layer 5 is reversed so as to become the same direction as the magnetization direction 3CM of the upper ferromagnetic layer 3C will 5 now be explained with reference to FIG. 9. FIG. 9 is an energy-band diagram at the same location as that of FIG. 7. FIG. 9 shows a state where voltages are applied to the gate electrode layer 18 and drain electrode layer 20, while the magnetization direction 5M of the free layer 5 is reversed.

In the state shown in FIG. 9, the magnetization direction 5M of the free layer 5 is the same as the magnetization direction 3CM of the upper ferromagnetic layer 3C, whereby the electrons es injected in the semiconductor layer 4 mostly flow into the free layer 5 through the interface between the semiconductor layer 4 and free layer 5. The potential difference φD occurring in the free layer 5 is smaller when the magnetization direction 5M of the free layer 5 is parallel to the magnetization direction 3CM of the upper ferromagnetic layer 3C than when antiparallel.

In the spin transistor in which the conduction of the semiconductor layer 4 is of p-type, as in the foregoing, the upper ferromagnetic layer 3C is a ferromagnetic metal, the work function φm of the ferromagnetic metal constituting the upper ferromagnetic layer 3C and the work function φs of the semiconductor layer 4 satisfy the relationship of φm<φs, the upper ferromagnetic layer 3C and the semiconductor layer 4 are in Schottky contact with each other, and the potential of the lower end of the conduction band in the semiconductor layer 4 can rise in response to the potential applied to the gate electrode layer 18 such that electrons flow from the upper ferromagnetic layer 3C to the semiconductor layer 4.

When the work functions satisfy the relationship of φm<φs, the potential barrier PB against holes occurs between the upper end Ev of the valence band and the metal, while a moderate energy barrier EP against the electrons em exists in the vicinity of the interface between the semiconductor layer 4 and the metal (see FIG. 7), so that no carriers migrate, whereby no electrons flow into the semiconductor layer 4 from the upper ferromagnetic layer 3C in the equilibrium state. When the gate potential is raised, electrons gather at the part of the semiconductor layer 4 adjacent to the gate electrode layer 18 as the gate potential rises. At the same time, the moderate energy barrier EP lowers, i.e., the potential at the lower end of the conduction band Ec increases, in response to the applied potential, whereby the electrons em can flow into the semiconductor layer 4 from the upper ferromagnetic layer 3C.

A method of manufacturing the spin transistor 30 in accordance with this embodiment will now be explained with reference to FIGS. 10A to 16D. FIGS. 10A, 11A, 12A, 13A, 14A, 15A and 16A are plan views of intermediates of the spin transistor 30. FIGS. 10B, 11B, 12B, 13B, 14B and 15B are end views of intermediates of the spin transistor 30 taken along predetermined lines in FIGS. 10A, 11A, 12A, 13A, 14A and 15A respectively. FIGS. 16B, 16C and 16D are end views of an intermediate of the spin transistor 30 taken along predetermined lines in FIG. 16A.

First, as shown in FIGS. 10A and 10B, the source electrode layer 12 (first electrode layer) made of a conductive material such as Cu having a predetermined pattern is formed on the silicon substrate 10, the magnetoresistive element 14 is formed on the whole surface so as to be electrically connected to the source electrode layer 12, and a patterned resist mask 15 is formed thereon in a part to leave the magnetoresistive element 14 in future. Here, the source electrode layer 12 and magnetoresistive element 14 can be formed by a sputtering apparatus, for example.

Subsequently, as shown in FIGS. 11A and 11B, the part of the magnetoresistive element 14 not covered with the resist mask 15 is removed by ion milling or the like. This forms a pattern of the magnetoresistive element 14.

Figure 12B:
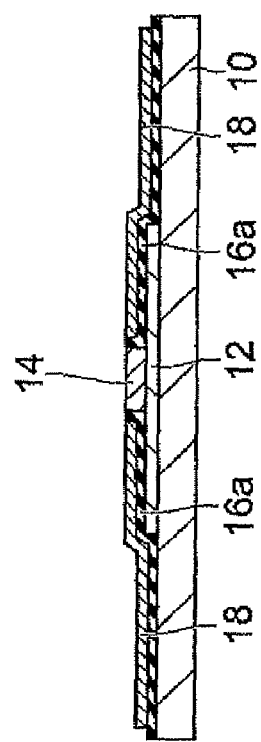
FIG. 12B is an end view of an intermediate of the spin transistor 30.
Figure 12A:
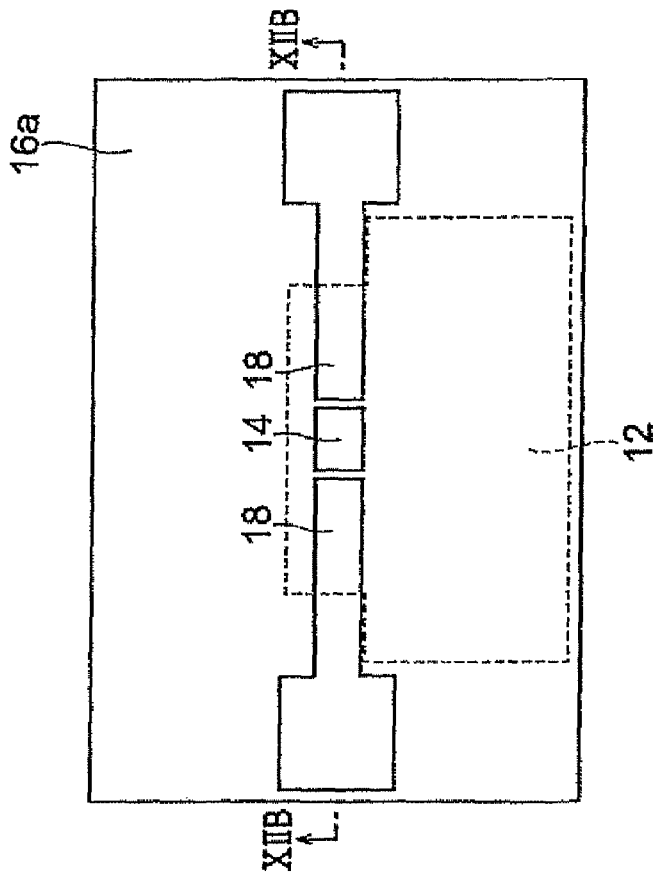
FIG. 12A is a plan view of an intermediate of the spin transistor 30.

Next, as shown in FIGS. 12A and 12B, the lower gate insulating layer 16a made of $SiO_2$ or the like is formed on side faces of the magnetoresistive element 14 and exposed surfaces of the source electrode layer 12 and silicon substrate 10. Thereafter, a pair of patterned gate electrode layers 18 made of a conductive material such as Cu are formed laterally adjacent to the magnetoresistive element 14 through the lower gate insulating layer 16a. Here, the lower gate insulating layer 16a can be formed by a CVD (Chemical Vapor Deposition) apparatus using $Si(OC_2H_5)_4$, for example.

Figure 13A:
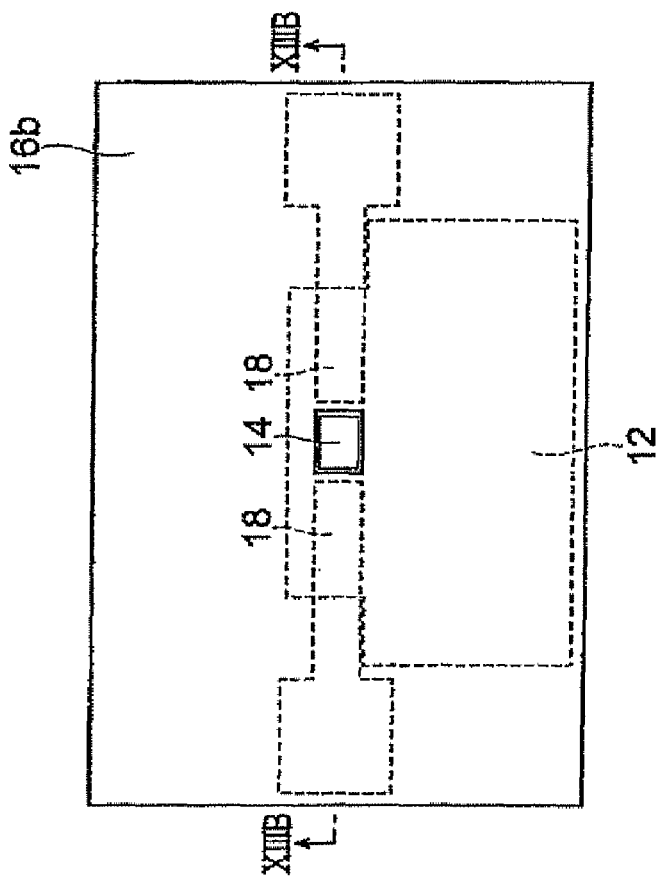
FIG. 13A is a plan view of an intermediate of the spin transistor 30.
Figure 13B:
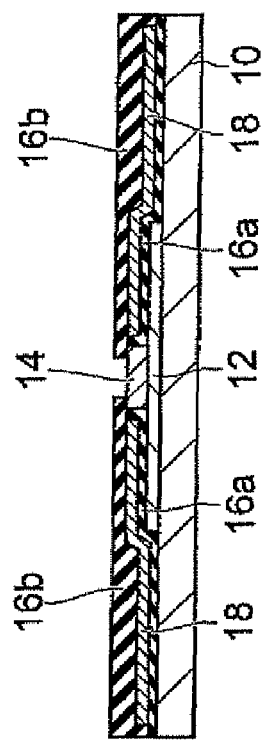
FIG. 13B is an end view of an intermediate of the spin transistor 30.

Subsequently, as shown in FIGS. 13A and 13B, the upper gate insulating layer 16b made of $SiO_2$ or the like is formed on the whole surface, the whole surface is flattened by CMP (Chemical Mechanical Polishing) or the like thereafter, and then a through hole is formed in the part of the upper gate insulating layer 16b laminated on the magnetoresistive element 14, so as to expose the magnetoresistive element 14. The through hole can be made, for example, by forming a resist pattern masking the part other than an area to be formed with the through hole on the flattened upper gate insulating layer 16b, eliminating the unmasked area of the upper gate insulating layer 16b by a reactive ion etching apparatus using $C_4F_8$ or the like thereafter, and then removing the resist pattern.

Subsequently, as shown in FIGS. 14A and 14B, the drain electrode layer 20 made of a conductive material such as Cu having a predetermined pattern is formed by a sputtering apparatus, for example, so as to be electrically connected to the magnetoresistive element 14.

Next, as shown in FIGS. 15A and 15B, the protective layer 22 made of $SiO_2$ or the like is formed on the whole surface by a CVD (Chemical Vapor Deposition) apparatus using $Si(OC_2H_5)_4$, for example, and then the surface is lapped by CMP (Chemical Mechanical Polishing) or the like, so as to become flat.

Subsequently, as shown in FIGS. 16A, 16B, 16C and 16D, the surface of the protective layer 22 is masked with a resist except for the areas to be formed with the drain electrode layer pads 28, source electrode layer pads 24, and gate electrode layer pads 26 in future, the unmasked area of the protective layer 22 is removed by a reactive ion etching apparatus using C₄F₈ or the like, for example, so as to form through holes reaching the drain electrode layer 20, source electrode layer 12, and gate electrode layer 18, and a conductive material such as Au is formed into a pair of drain electrode layer pads 28, a pair of source electrode layer pads 24, and a pair of gate electrode layer pads 26 by a sputtering apparatus or the like.

Thereafter, for securing the respective magnetization directions 3CM and 3AM of the upper ferromagnetic layer 3C and lower ferromagnetic layer 3A in the fixed layer 3, these layers are heated to about the blocking temperature of the antiferromagnetic layer 2 while a magnetic field is applied in the X-axis direction, and then cooled (see FIG. 3). This secures the respective magnetization directions 3CM and 3AM of the upper ferromagnetic layer 3C and lower ferromagnetic layer 3A in the fixed layer 3, and sets the axis of easy magnetization of the free layer 5 to the X-axis direction. The foregoing steps yield the spin transistor 30 in accordance with this embodiment.

In the above-mentioned spin transistor 30 in accordance with this embodiment, the gate electrode layer 18 is laterally adjacent to the semiconductor layer 4 through the gate insulating layer 16 provided on the side face 4L of the semiconductor layer 4, whereby the channel length formed in the semiconductor layer 4 is on a par with the thickness 4t of the semiconductor layer 4 (see FIG. 3). The thickness 4t of the semiconductor layer 4 is the thickness of the semiconductor layer 4 in the laminating direction thereof and thus can easily be controlled by film-forming conditions at the time of forming the semiconductor layer 4 and can be reduced. Therefore, the channel length can be made shorter than in the conventional spin transistors in which the reduction of channel length is restricted by fine processing techniques.

In this embodiment, the thickness 4t of the semiconductor layer 4 is preferably 1 to 30 nm, more preferably 1 to 20 nm, whereby the spin-polarized electrons es injected in the semiconductor layer 4 are substantially kept from effecting spin diffusion within the semiconductor layer 4, so as to be subjected to ballistic conduction from the spin-polarized carrier injection layer 3 to the spin filter layer 5. Consequently, the electrons having a high spin polarization ratio reach the spin filter layer 5. As a result, a spin transistor in which the resistance between the source electrode layer 12 and drain electrode layer 20 changes by a greater ratio between when the magnetization directions of the spin-polarized carrier injection layer 3 and spin filter layer 5 are parallel and antiparallel can be obtained. Since the semiconductor layer 4 has a thickness of 1 nm or greater, no drain current flows when no voltage is applied to the gate electrode layer 18, whereby the function of the spin transistor 30 as a field-effect transistor is kept.

In the spin transistor 30 in accordance with this embodiment, a pair of gate electrode layers 18 are provided so as to laterally hold the semiconductor layer 4 therebetween (see FIGS. 2 and 3). This makes it possible to form two channels in the semiconductor layer 4 by applying a voltage between the pair of gate electrode layers 18. As a result, a spin transistor in which the resistance between the source electrode layer 12 and drain electrode layer 20 changes by a greater ratio between when the respective magnetization directions 3CM and 5M of the spin-polarized carrier injection layer 3 and spin filter layer 5 are parallel and antiparallel can be obtained.

The spin transistor 30 in accordance with this embodiment includes the gate electrode layer pad 26 and source electrode layer pad 24 acting as gate voltage applying means for applying a voltage to the gate electrode layer 18, and the drain electrode layer pad 28 and source electrode layer pad 24 acting as drain voltage applying means for applying a voltage to the drain electrode layer 20 (see FIGS. 1 and 2). Therefore, the spin transistor 30 adapted to easily apply the gate voltage and drain voltage can be obtained.

In the spin transistor 30 in accordance with this embodiment, the fixed layer 3 includes the lower ferromagnetic layer 3A and upper ferromagnetic layer 3C laminated with the nonmagnetic layer 3B interposed therebetween, while the lower ferromagnetic layer 3A and upper ferromagnetic layer 3C are exchange-coupled so as to have respective magnetization directions antiparallel to each other (see FIG. 3). This makes the magnetization direction 3CM of the fixed layer 3 more stable, whereby operations of the spin transistor 30 can be stabilized.

The spin transistor 30 in accordance with this embodiment is adapted to reverse the magnetization direction 5M of the free layer 5 when a current flows through the magnetoresistive element 14 in the laminating direction thereof. This can yield the spin transistor 30 adapted to change its output characteristic by simply causing a current to flow through the magnetoresistive element 14. Since no mechanisms for reversing the magnetization direction 5M of the free layer 5 by external magnetic fields are necessary, the spin transistor 30 can be made smaller. When two states where the respective magnetization directions 5M and 3CM of the free layer 5 and fixed layer 3 are parallel and antiparallel are assigned to one bit, the spin transistor 30 usable as a nonvolatile semiconductor memory can be obtained.

In the spin transistor 30 in accordance with this embodiment, each of the free layer 5 and fixed layer 3 is in Schottky contact with the semiconductor layer 4. This can reduce the probability of spin diffusion of spin-polarized electrons es at the time when they pass through the interface between the free layer 5 and semiconductor layer 4 and the interface between the fixed layer 3 and semiconductor layer 4. As a result, a spin transistor in which the resistance between the source electrode layer 12 and drain electrode layer 20 changes by a greater ratio between when the respective magnetization directions 3CM and 5M of the spin-polarized carrier injection layer 3 and spin filter layer 5 are parallel and antiparallel can be obtained.

Without being restricted to the above-mentioned embodiment, the present invention can be modified in various manners.

Figure 17:
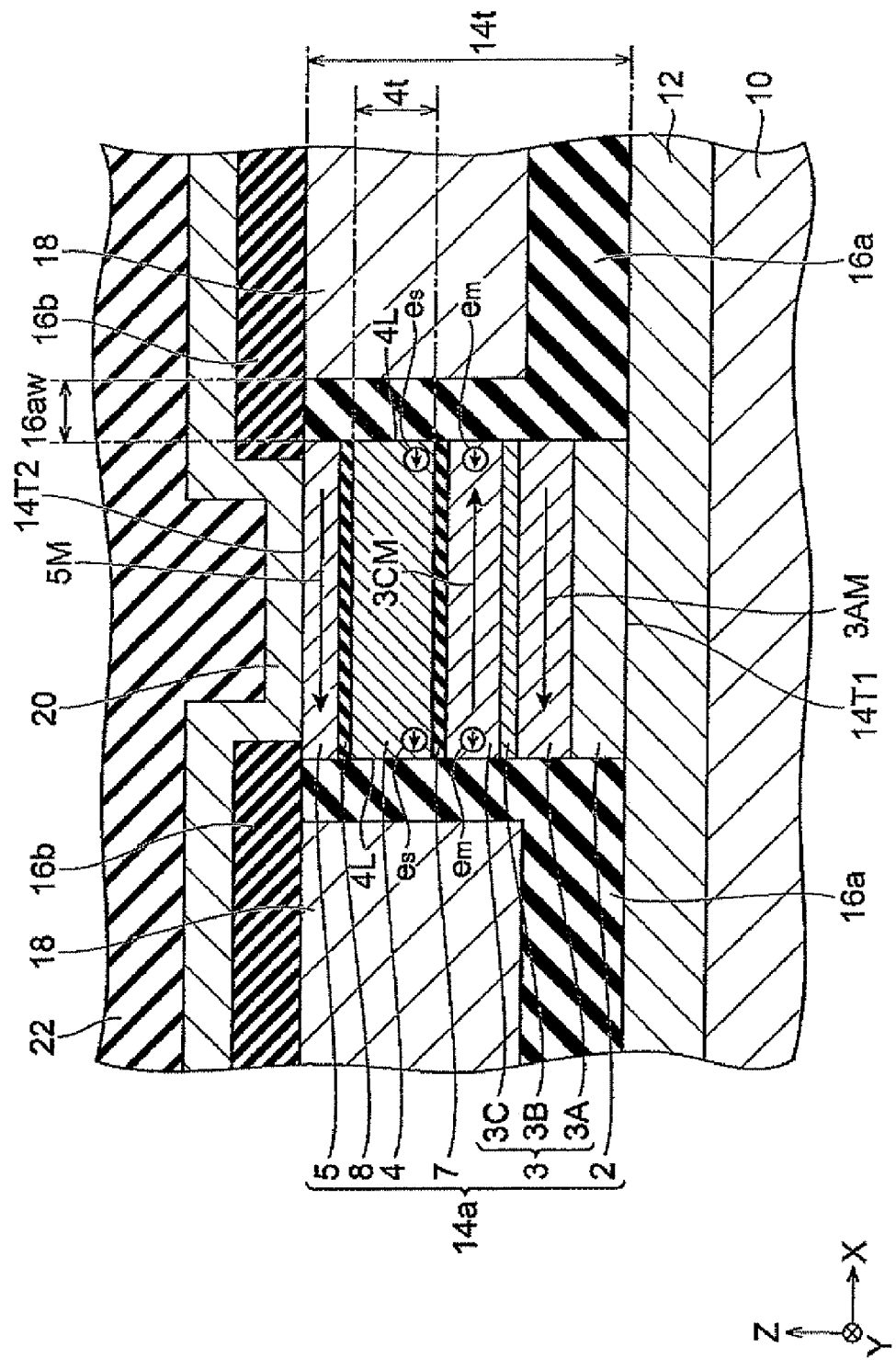
FIG. 17 is a sectional view showing a modified example of the embodiment.

For example, as shown in FIG. 17, a magnetoresistive element 14a may further comprise tunnel barrier layers 8 and 7 between the free layer 5 and semiconductor layer 4 and between the fixed layer 3 and semiconductor layer 4, respectively. This can lower the probability of spin diffusion of spin-polarized electrons at the time when they pass through the interface between the free layer 5 and semiconductor layer 4 and the interface between the fixed layer 3 and semiconductor layer 4 as in the above-mentioned embodiment in which each of the free layer 5 and fixed layer 3 is in Schottky contact with the semiconductor layer 4. As a result, a spin transistor in which the resistance between the source electrode layer 12 and drain electrode layer 20 changes by a greater ratio between when the respective magnetization directions 3CM and 5M of the spin-polarized carrier injection layer 3 and spin filter layer 5 are parallel and antiparallel can be obtained. The magnetoresistive element 14a may have one of the tunnel barrier layers 8 and 7 alone.

Though both of the free layer 5 and fixed layer 3 are in Schottky contact with the semiconductor layer 4 in the above-mentioned embodiment, one of them may be in ohmic contact while the other is in Schottky contact, or both of them may be in ohmic contact with the semiconductor layer 4.

Though the above-mentioned embodiment can reverse the magnetization direction 5M of the free layer 5 by causing a current to flow through the magnetoresistive element 14 in the laminating direction thereof, the magnetization direction 5M of the free layer 5 may be reversed by applying an external magnetic field to the free layer 5.

Though the fixed layer 3 includes the lower ferromagnetic layer 3A and upper ferromagnetic layer 3C laminated with the nonmagnetic layer 3B interposed therebetween, while lower ferromagnetic layer 3A and upper ferromagnetic layer 3C are exchange-coupled such that their respective magnetization directions are antiparallel to each other (see FIG. 3) in the above-mentioned embodiment, this is not restrictive. For example, the fixed layer 3 may be constituted by the upper ferromagnetic layer 3C alone without including the nonmagnetic layer 3B and lower ferromagnetic layer 3A. The magnetoresistive element 14 may be free of the antiferromagnetic layer 2, while the fixed layer 3 is constituted by the upper ferromagnetic layer 3C alone. In this case, the upper ferromagnetic layer 3C may be constituted by a hard magnetic material or provided with magnetic shape anisotropy, induced magnetic anisotropy, or the like, so as to fix its magnetization direction 3CM.

Though a pair of gate electrode layers 18 are provided so as to laterally hold the semiconductor layer 4 therebetween (see FIGS. 2 and 3) in the above-mentioned embodiment, the spin transistor 30 is also operable when it includes only one gate electrode layer 18. The gate electrode layer 18 may laterally surround the semiconductor layer 4 as a whole.

Though the electrode in contact with one end face 14T1 of the magnetoresistive element 14, which is the end face closer to the fixed layer 3 than the semiconductor layer 4, is the source electrode layer 12, while the electrode in contact with the other end face 14T2 of the magnetoresistive element 14, which is the end face closer to the free layer 5 than the semiconductor layer 4, is the drain electrode layer 20 (see FIG. 3), the electrodes in contact with the end faces 14T1 and 14T2 may be the drain and source electrode layers, respectively. In this case, the fixed layer 3 and free layer 5 become a spin filter layer and a spin-polarized carrier injection layer, respectively.

In the conventional MOSFET (Metal-Oxide-Semiconductor Field Effect Transistor), the side generating carriers is defined as "source", whereas the conduction type of a semiconductor directly under the gate differs from that of the source. In the spin transistor 30 in accordance with this embodiment, on the other hand, carriers are spin-polarized electrons or holes, and the side from which the carriers flow into the semiconductor layer 4 is the source electrode layer. When carriers injected from the source electrode layer are holes, they hold a spin opposite from the spin in the electronic state of lost electrons.

What is claimed is:

1. A spin transistor comprising:
   a magnetoresistive element having a fixed layer, a free layer, and a semiconductor layer provided between the fixed layer and free layer;
   a source electrode layer electrically connected to one end face in a laminating direction of the magnetoresistive element;
   a drain electrode layer electrically connected to the other end face in the laminating direction of the magnetoresistive element; and
   a gate electrode layer laterally adjacent to the semiconductor layer through a gate insulating layer provided on a side face of the semiconductor layer,
   wherein the semiconductor layer is made of a nonmagnetic material.

2. A spin transistor according to claim 1, wherein a pair of gate electrode layers are provided so as to laterally hold the semiconductor layer therebetween.

3. A spin transistor according to claim 1, further comprising:
   gate voltage applying means for applying a voltage to the gate electrode layer; and
   drain voltage applying means for applying a voltage to the drain electrode layer.

4. A spin transistor according to claim 1, wherein the fixed layer includes first and second ferromagnetic layers laminated with a nonmagnetic layer interposed therebetween; and wherein the first and second ferromagnetic layers are exchange-coupled so as to have respective magnetization directions antiparallel to each other.

5. A spin transistor according to claim 1, wherein the spin transistor is adapted to reverse the magnetization direction of the free layer when a current flows through the magnetoresistive element in the laminating direction thereof.

6. A spin transistor according to claim 1, wherein the semiconductor layer has a thickness of 1 to 30 nm.

7. A spin transistor according to claim 1, wherein the semiconductor layer is constituted by Si, Ge, or ZnO.

8. A spin transistor according to claim 1, wherein at least one of the free layer and fixed layer is in Schottky contact with the semiconductor layer.

9. A spin transistor according to claim 1, wherein the magnetoresistive element further comprises a tunnel barrier layer provided in at least one of gaps between the free layer and semiconductor layer and between the fixed layer and semiconductor layer.

* * * * *